United States Patent [19]

Nose et al.

[11] Patent Number: 5,379,108
[45] Date of Patent: Jan. 3, 1995

[54] ALIGNMENT SYSTEM

[75] Inventors: Noriyuki Nose, Atsugi; Naoto Abe, Isehara, both of Japan

[73] Assignee: Canon Kabushiki Kaisha, Tokyo, Japan

[21] Appl. No.: 91,959

[22] Filed: Jul. 15, 1993

[30] Foreign Application Priority Data

Jul. 17, 1992 [JP] Japan .................................. 4-190946

[51] Int. Cl.⁶ .............................................. G01B 11/00
[52] U.S. Cl. ..................................... 356/400; 250/548; 356/401
[58] Field of Search ................. 356/400, 401; 250/548

[56] References Cited

U.S. PATENT DOCUMENTS

| | | | |
|---|---|---|---|
| 4,880,308 | 11/1989 | Shirasu ................................ | 356/401 |
| 5,142,156 | 8/1992 | Ozawa et al. ........................ | 250/548 |
| 5,182,615 | 1/1993 | Kurosawa et al. .................. | 356/400 |
| 5,200,800 | 4/1993 | Suda et al. .......................... | 356/401 |

Primary Examiner—F. L. Evans
Attorney, Agent, or Firm—Fitzpatrick, Cella, Harper & Scinto

[57] ABSTRACT

An alignment system includes an alignment detector for detecting a relative deviation of the mask and the wafer from a predetermined positional relationship, a stage mechanism for moving the mask relative to the wafer, an interferometer device for producing information related to the movement by the stage mechanism, and a controller for determining an input to be applied to the stage mechanism so as to bring the mask and the wafer into the predetermined positional relationship, on the basis of a detected value obtained through the alignment detector and a measured value obtained through the interferometer device, both being uptaken at the same timing, and for controlling the stage mechanism on the basis of the thus determined input.

8 Claims, 8 Drawing Sheets

ALIGNMENT SYSTEM

FIELD OF THE INVENTION AND RELATED ART

This invention relates generally to an alignment system usable in manufacture of semiconductor devices, for example, for aligning two objects very precisely.

In an exposure apparatus for manufacturing semiconductor devices such as integrated circuits or liquid crystal panels, for example, relative positioning (alignment) of an original (mask or reticle) and a wafer for accurate lithographic transfer of a fine pattern formed on the original onto the wafer, is an important factor in attaining enhanced degree of integration of each semiconductor device. Particularly, in recent exposure apparatuses, an alignment precision higher than the submicron order is required for an alignment system used.

Usually, for such an alignment operation, alignment marks (patterns) are provided on an original and a wafer and, on the basis of relative positional error information optically obtained from these alignment patterns, relative positioning of the original and the wafer is carried out.

SUMMARY OF THE INVENTION

Generally, in an exposure apparatus, the whole structure is mounted on a base having an anti-vibration function, in order to block the transmission of vibration to a wafer stage on which a wafer is placed. However, complete vibration blocking is difficult to attain and, actually, any external vibration or vibration produced by a motor of a stage driving system is transmitted to the wafer stage. This causes minute displacement of the wafer, such as illustrated in FIG. 4. Such vibration is small, of an order not greater than several hundreds of Hz in terms of frequency. But, there are a few cases wherein it has an amplitude of the order of 0.01 micron. Occasionally, a vibration amplitude of 0.05 micron, close to the alignment tolerance limit, may be caused. For further enhancement of precision of an exposure apparatus, the problem of such vibrations should be solved.

It is accordingly an object of the present invention to provide an alignment system by which a high-precision alignment operation is assured even in an environment of minute vibrations.

It is another object of the present invention to provide an exposure apparatus or a device manufacturing method which is based on such an alignment system.

In accordance with an aspect of the present invention, to achieve at least one of these objects, an alignment system includes alignment detecting means for detecting an error of first and second objects from a predetermined positional interrelationship, moving means for relatively moving the second object relative to the first object, measuring means for producing information related to the movement by the moving means, and control means for determining an input to be applied to the moving means so as to bring the first and second objects into the predetermined positional interrelationship on the basis of the error detected by the detecting means and the information produced by the measuring means, both obtained at the same timing, and then for controlling the moving means in accordance with the determined input.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

In this embodiment, the invention is applied to a proximity type X-ray exposure apparatus. The type of exposure apparatus is not limited to this, but the invention is applicable also to a reduction X-ray exposure apparatus or a projection exposure apparatus using i-line light or excimer light, for example.

Figure 1:
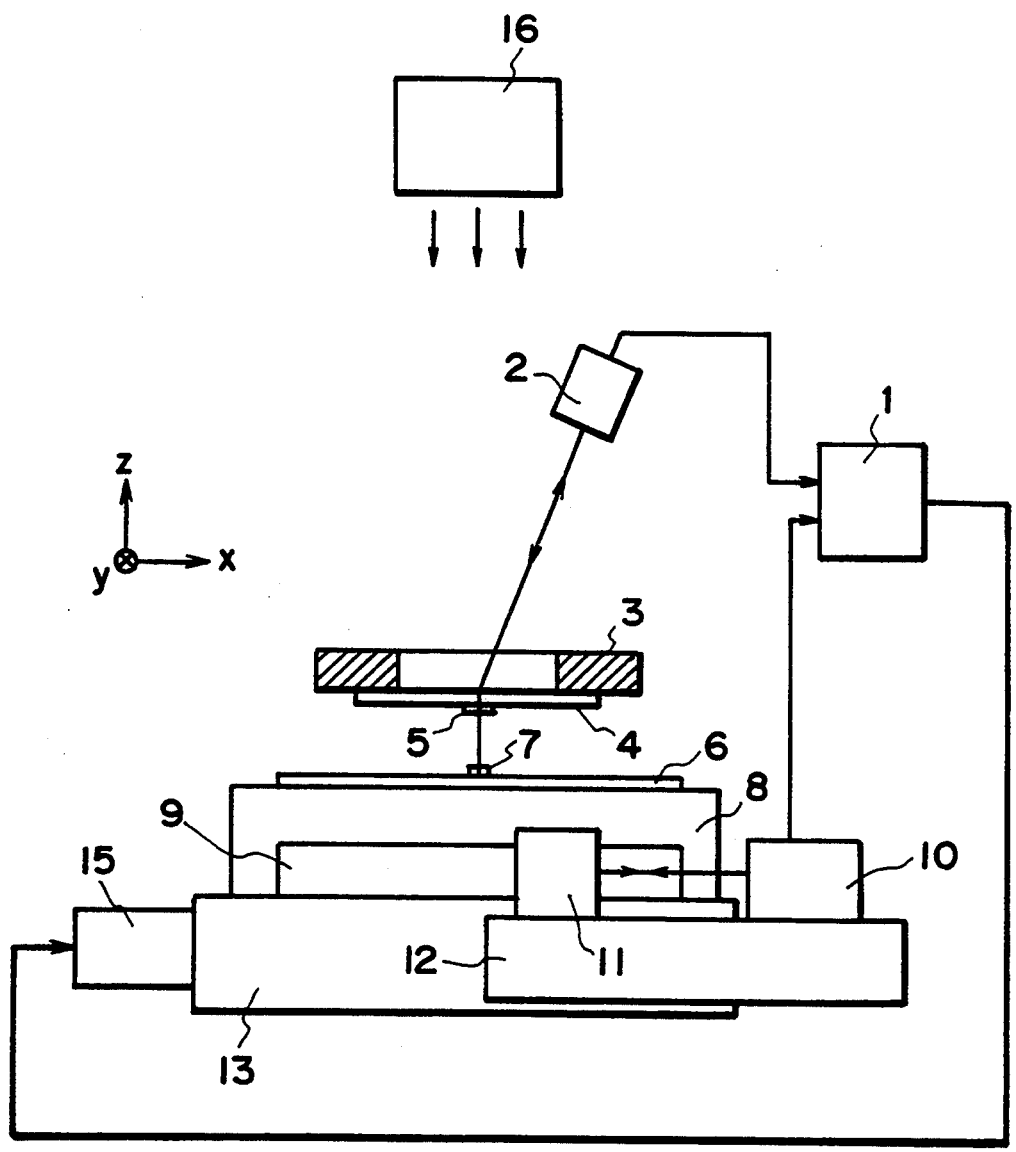
FIG. 1 is a schematic side view of an exposure apparatus according to an embodiment of the present invention.
Figure 2:
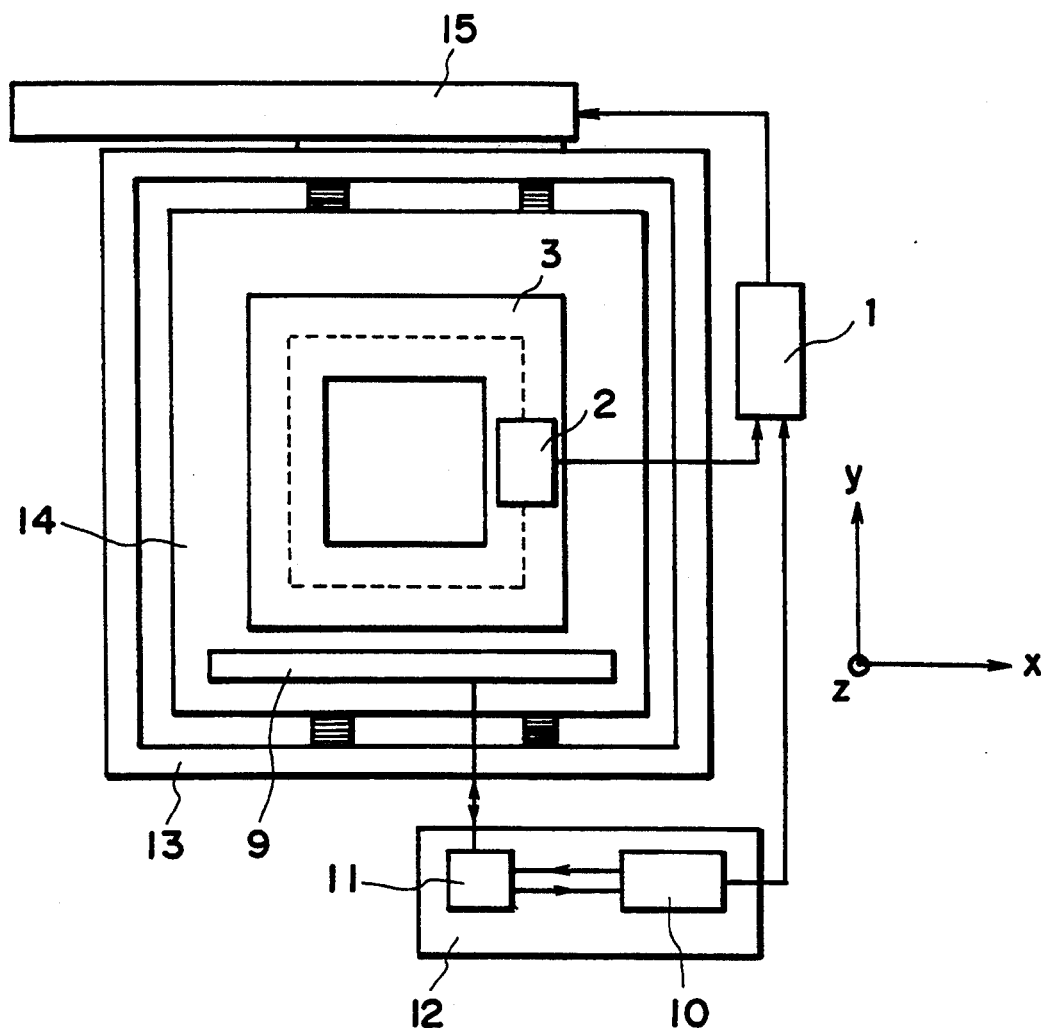
FIG. 2 is a top plan view of an exposure apparatus according to an embodiment of the present invention.

FIGS. 1 and 2 show the structure of this embodiment. In these drawings, denoted at 1 is a controller having a computer controlling function, for controlling the system as a whole. Denoted at 2 is an alignment detector for detecting relative positional deviation between a mask and a wafer. It includes a light source (e.g. a semiconductor laser or LED) and a light receiving sensor (e.g. a CCD array sensor). Denoted at 3 is a mask chuck; denoted at 4 is a mask (original) having a semiconductor device circuit pattern formed thereon; denoted at 5 is an alignment pattern which is provided on the mask 4; denoted at 6 is a semiconductor wafer; denoted at 7 is an alignment pattern formed on the wafer 6; denoted at 8 is a wafer chuck for holding the wafer; denoted at 9 is a reflection mirror; denoted at 10 is a unit which includes a laser light source and a photodetector of a laser interferometer; denoted at 11 is an optical unit of the interferometer: and denoted at 12 is a base on which the units 10 and 11 are mounted. The elements 9, 10, 11 and 12 cooperate to provide a laser interferometer distance measuring device. Denoted at 13 and 14 are components of a stage mechanism for supporting and relatively moving the wafer chuck 8 relative to the mask chuck 3; and denoted at 15 is a driving mechanism for moving the stage. Denoted at 16 is an X-ray irradiation system having an X-ray source for producing X-rays (exposure energy).

Figure 3:
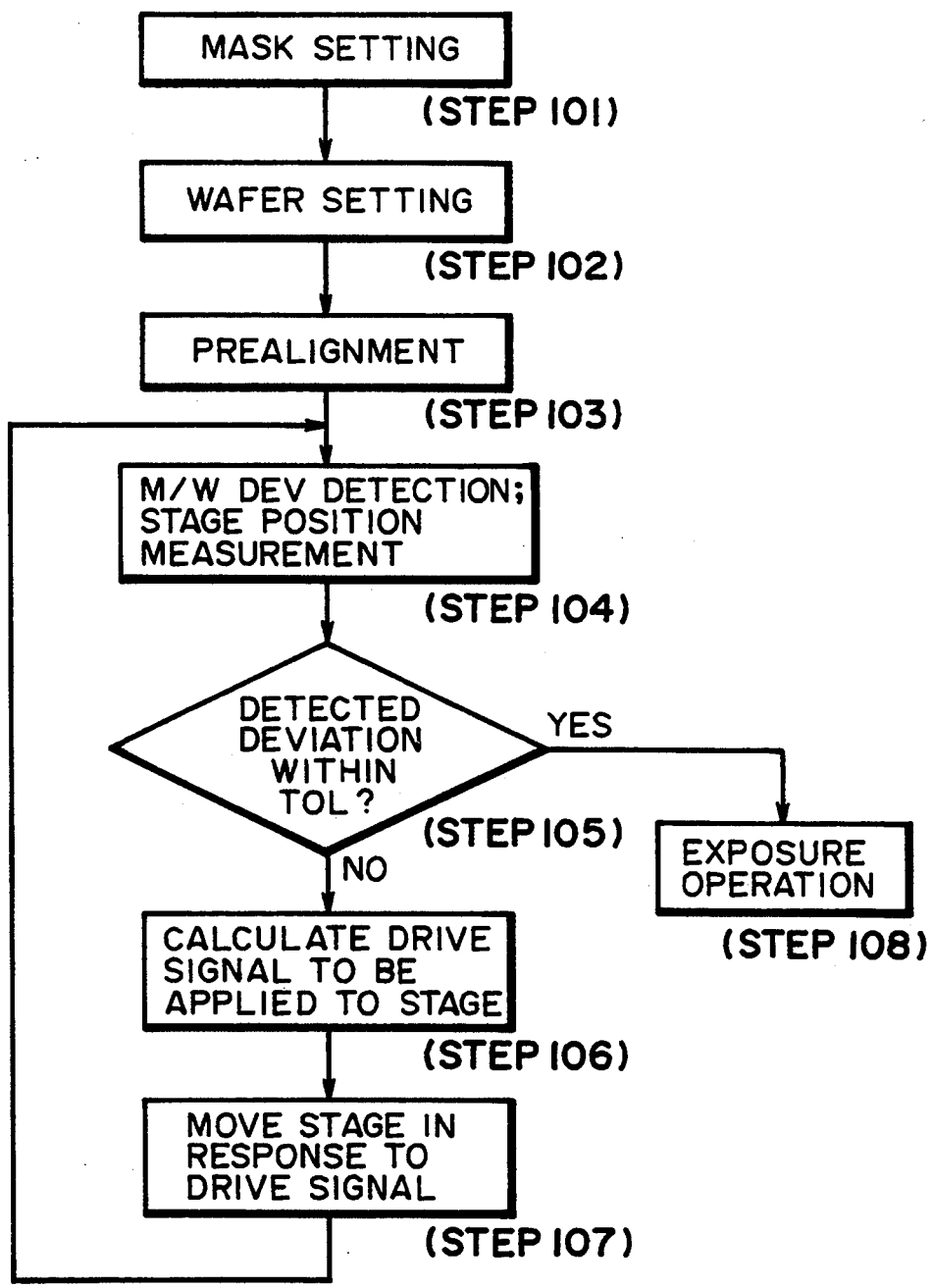
FIG. 3 is a flow chart of an operational sequence of the present invention.

Now, the operation for aligning a mask and a wafer in the structure described above, will be explained. FIG. 3 is a flow chart of the mask-to-wafer alignment sequence. First, a mask is set on the mask chuck (step 101), and a wafer is set on the wafer chuck (step 102). Then, relatively rough alignment of the set mask and wafer (called "prealignment") is executed (step 103). After this prealignment, any relative deviation between the mask (M) and the wafer (W) is measured by using the alignment detector (step 104).

Figure 5:
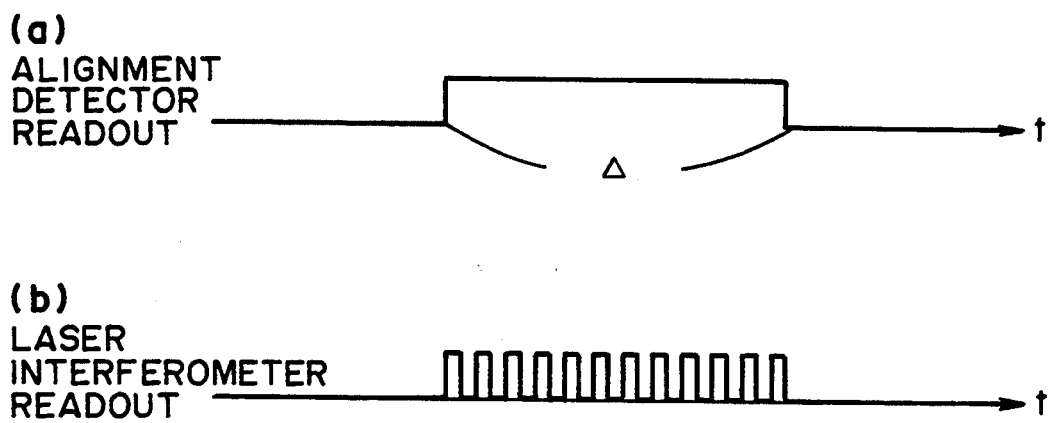
FIG. 5 is a timing chart, showing the detection timing of an alignment detector and a laser interferometer distance measuring device.

Simultaneously with the deviation measurement by the alignment detector at step 104, the stage position is measured or detected by using the laser interferometer distance measuring device. FIG. 5 shows signals obtainable by this measurement. As illustrated, the positional deviation detection signal and the stage position measurement signal are obtained at the same timing ((a) and (b)).

Generally, such a positional deviation can be detected optically, and many methods are known in the art. The following examples may be adopted in this embodiment:

(1) Alignment patterns 5 and 7 are detected by an image pickup device, and the deviation between them is detected in accordance with an image processing operation.

(2) Alignment patterns 5 and 7 are provided by diffraction gratings, and a light beam is projected to them. From the signal intensity of diffraction light therefrom, the phase error of the grating is detected and the deviation of the mask and the wafer is calculated.

(3) Alignment patterns 5 and 7 are provided by zone plates, and a light beam is projected to them. From the direction of diffraction of diffracted light therefrom, the deviation of the mask and the wafer is determined.

After the measurement, whether the detected alignment error is within the range of tolerance (step 105) is checked. If the error is beyond the tolerance, an operation input, to be applied to the stage for attaining correct alignment of the mask and the wafer, is calculated on the basis of the detected error (step 106). This operation input may be determined on the basis of (i) the detected value obtained through the alignment detector and (ii) the measured valued obtained through the laser interferometer distance measuring device in step 104, and in accordance with the following equation:

operation input $= A - B$ wherein A is the measured stage position and B is the detected error.

Then, in accordance with the operation input, the wafer stage is driven (step 107), and the sequence goes back to step 104. If the discrimination at step 105 shows that the error is within the tolerance (e.g. not greater than 0.02 micron), the exposure operation (step 108) starts. For the exposure operation, X-rays produced from the X-ray irradiation system are projected to the mask, and the circuit pattern of the mask is lithographically transferred to the wafer.

Figure 4:
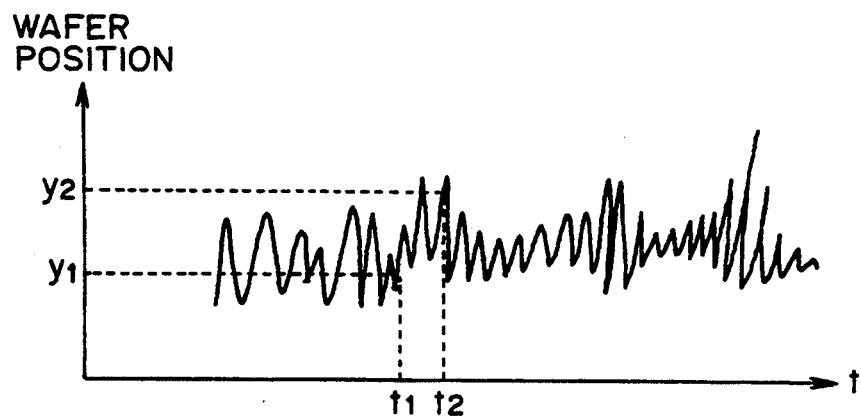
FIG. 4 is a graph showing the displacement of wafer position due to a vibration.

Now, the operation of this embodiment will be explained with reference to FIG. 4.

In accordance with a conventional method, the alignment error may be detected at moment $t_1$ by using an alignment detector and, after this, the output of a laser interferometer distance measuring device is read at moment $t_2$. Based on this output of the laser interferometer, an input for stage driving may be calculated. In this method, as seen in FIG. 4, the calculated input may contain an error corresponding to the difference $|y_2 - y_1|$ in wafer position resulting from vibration in the period from time $t_1$ to time $t_2$. If this occurs, correct alignment results in failure even by moving the stage in accordance with the applied input.

In accordance with this embodiment of the present invention, the deviation detection and the stage position measurement are carried out at the same moment. There is no time difference or lag between them. As a result, even if the wafer position changes due to vibration or the like, it does not adversely affect the alignment precision and, consequently, very high precision alignment operation is assured.

Figure 6:
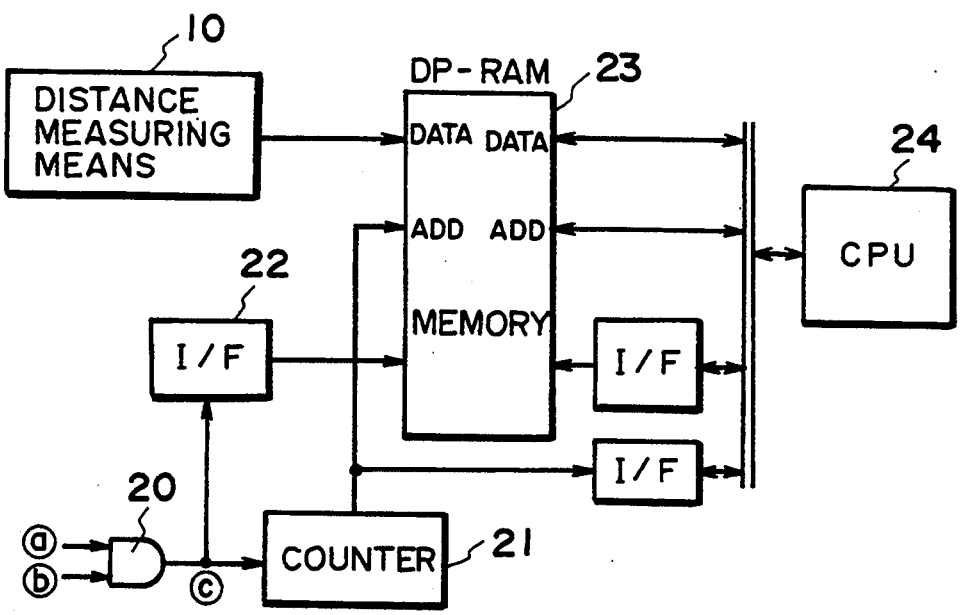
FIG. 6 is a block diagram of a signal processing system of an embodiment of the present invention.
Figure 7:
FIG. 7 is a waveform view, showing the waveforms of signals at different portions of the signal processing system of FIG. 6.
Figure 7:
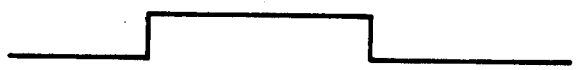
Figure 7:

FIG. 6 is a block diagram of a signal processing system of this embodiment, for determining the operation input to be applied to the stage. FIG. 7 shows signal waveforms at different portions of the signal processing system of FIG. 6. Signal (a) is a sample clock signal corresponding to synchronous read-out of the signal from the laser interferometer. For example, a clock signal is produced each twenty-two (22) μsec. Signal (b) is a timing signal for uptaking the output of the sensor (which may be CCD) of the alignment detector. This signal corresponds to the signal (a) in FIG. 5. The CCD signal is a digital signal, and the time period for signal uptaking may be determined while taking into account the transmissivity or reflectivity of the alignment mark or the intensity of the light source, so as to avoid saturation of the sensor with 0.1 to several hundreds msec. More specifically, the duration of light emission of the light source included in the alignment detector 2 may be controlled in accordance with the timing of the signal (b), by which the quantity of light to be received by the CCD may be set.

Signal (c) is a counter clock obtained through calculation of the logic sum of the signals (a) and (b) within a logic sum circuit 20. With this counter clock (c), the count in a counter 21 increments in the time period set by the signal (b), and a writing signal is applied through an I/F circuit 22 to a DP-RAM (dual port RAM) 23. Thus, outputs of the laser interferometer 10 are stored sequentially in the DP-RAM 23, from zero address. After elapse of the alignment signal uptaking period, a CPU 24 reads the count of the counter 21, and reads the data memorized in the DP-RAM 23 from the zero address to the address corresponding to that count. Then, an average of them is calculated, the calculated average representing the measured position of the stage. Then, on the basis of this measured value and the detected deviation obtained through the alignment detector at the same timing, the following calculation is made:

operation input $= A - B$ wherein A is the measured stage position and B is the detected deviation. Thus, the operation input to be applied to the stage is determined.

In the foregoing, for convenience of explanation, the embodiment has been described with reference to a single direction of an axis. Actually, however, arrangements of the same structure are provided with respect to both of the X and Y directions, and the alignment operation is carried out with respect to each of the X and Y directions. Further, the principle of alignment operation described above is applicable not only to the X-axis or Y-axis alignment but also to the alignment of a mask and a wafer in the direction of their spacing (Z direction).

Embodiment 2

Figure 8:
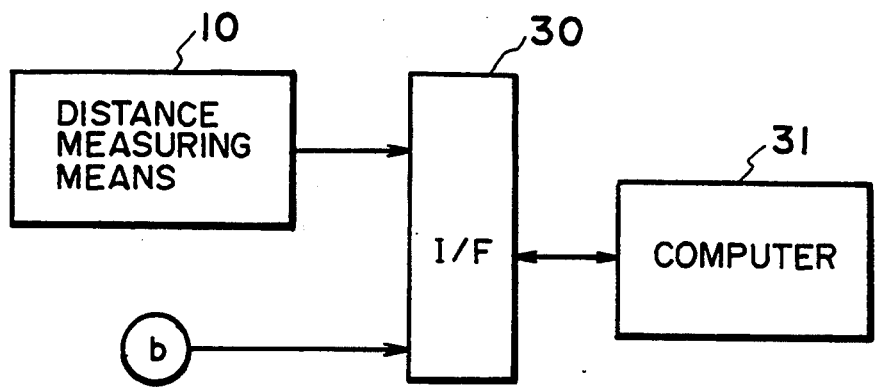
FIG. 8 is a block diagram of a modified form of a signal processing system.
Figure 9:
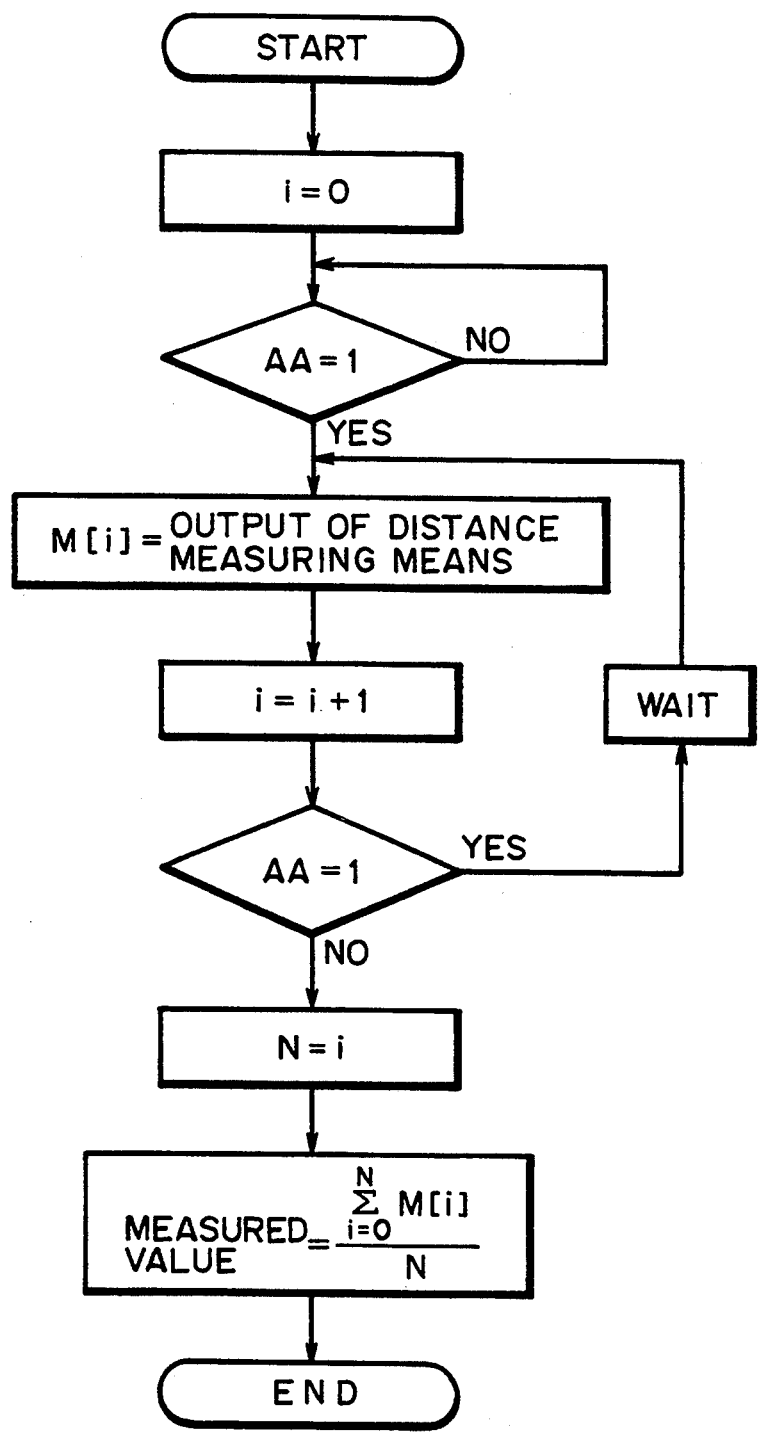
FIG. 9 is a flow chart of a processing sequence to be provided in the signal processing system of FIG. 8.

Referring now to FIGS. 8 and 9, a modified form of signal processing system adapted to measure the stage position in the timed relation with uptaking an alignment error detection signal, will be explained. FIG. 8 is a block diagram of such signal processing system, and FIG. 9 is a flow chart of the signal processing sequence. The signal processing system of this example shown in FIG. 8 is arranged so that a signal ⓑ which represents the time for uptaking the measured value of the laser interferometer distance measuring device 10 and the CCD signal of the alignment detector can be read by a computer 31 through an I/F circuit 30. In the computer 31, in accordance with the sequence depicted in the flow chart of FIG. 9, the signal of the laser interferometer 10 is read out in the time period in which the signal ⓑ is at "ON" level, while on the other hand, when the signal ⓑ is at "OFF" level, read-out of the interferometer signal is not performed. An average of the read sampling number N+1 is detected by calculation, the detected average being taken as the measured value of the stage position. In this embodiment, the uptaking timing is not fixed, but the necessary time is determined in accordance with the waiting routine and other processing time.

Embodiment 3

Next, an embodiment of semiconductor device manufacturing method using an exposure apparatus such as described above, will be explained.

Figure 10:
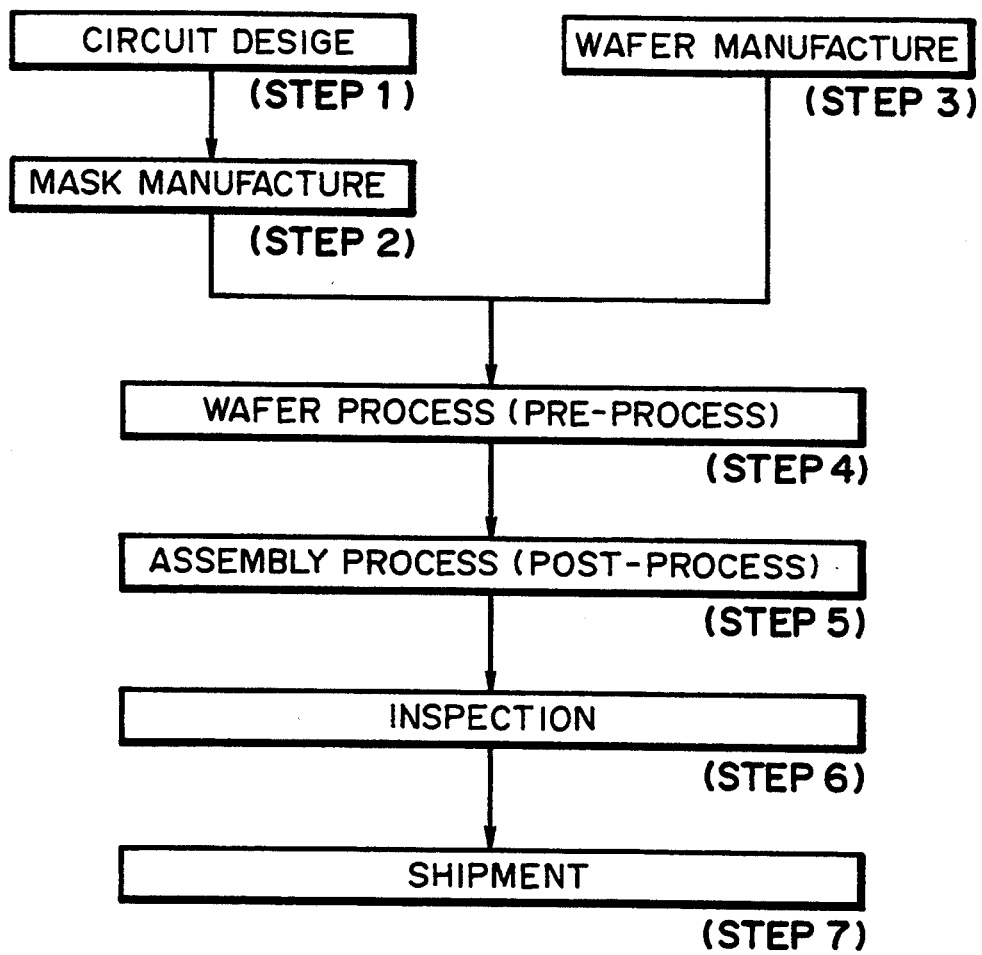
FIG. 10 is a flow chart of a semiconductor device manufacturing processes.

FIG. 10 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein an operability check, a durability check, and so on, of the semiconductor devices produced by step 5 are carried out. With these processes, semiconductor devices are finished and they are shipped (step 7).

Figure 11:
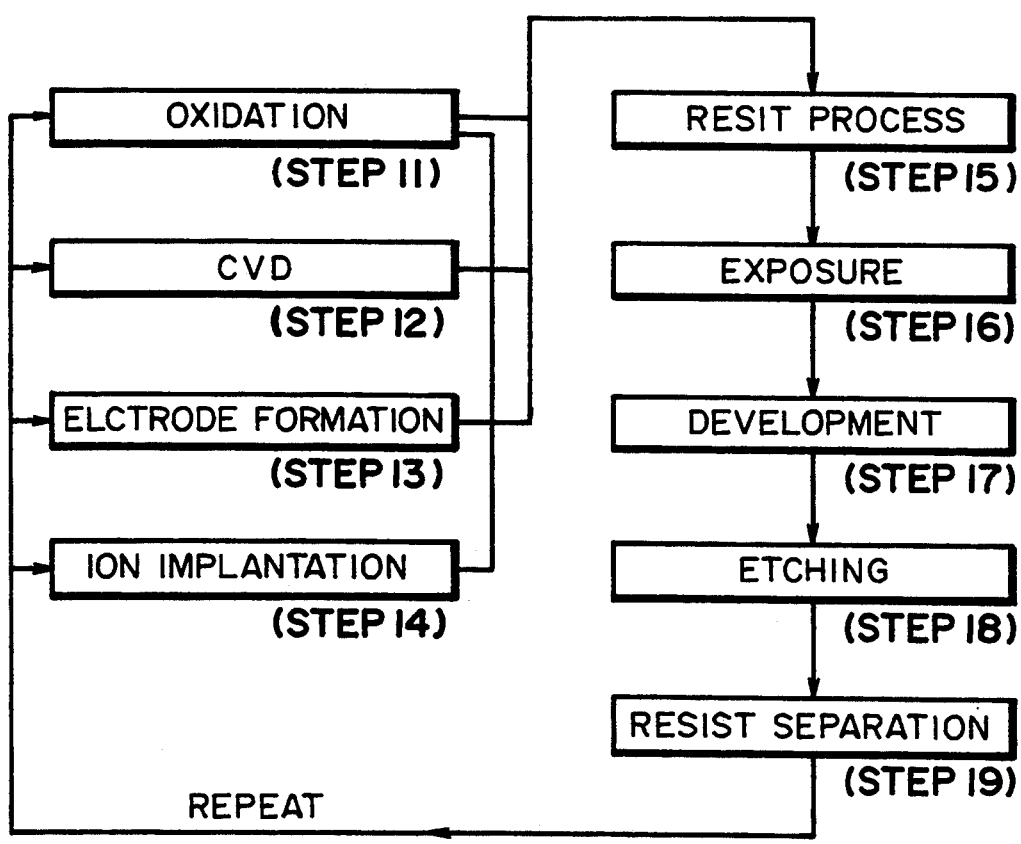
FIG. 11 is a flow chart of a wafer process.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An alignment system, comprising:
    alignment detecting means for detecting a relative deviation of first and second objects from a predetermined positional relationship;
    moving means for moving the first object relative to the second object;
    measuring means for producing information related to the movement by said moving means; and
    control means for determining an input to be applied to said moving means so as to bring the first and second objects into the predetermined positional relationship, on the basis of a detected value obtained through said alignment detecting means and a plurality of measured values obtained through said measuring means, all being taken up at the same time, and for controlling said moving means on the basis of the thus determined input.

2. A system according to claim 1, wherein said control means calculates an average value of the plurality of measured values and determines the input to be applied to said moving means on the basis of the detected value and the average value of the plurality of measured values.

3. An alignment method, comprising the steps of:
    detecting a relative deviation of first and second objects from a predetermined positional relationship;
    measuring the position of the second object;
    determining an input effective to bring the first and second objects into the predetermined positional relationship, on the basis of a detected value obtained through said deviation detection and a plurality of measured values obtained through said position measurement, all being taken up at the same time; and
    adjusting the positional relationship of the first and second objects on the basis of the thus determined input.

4. A method according to claim 3, wherein said determining step includes the steps of calculating an average value of the plurality of measured values and determining the input effective to bring the first and second objects into the predetermined positional relationship, on the basis of the detected value and the average value of the plurality of measured values.

5. An exposure apparatus, comprising:
    aligning means for aligning an original, having a pattern, and a workpiece; and
    transferring means for transferring the pattern of the original to the workpiece being relatively aligned with the original;
    wherein said aligning means includes (i) alignment detecting means for detecting a relative deviation of the original and the workpiece from a predetermined positional relationship, (ii) moving means for moving the workpiece relative to the original, (iii) measuring means for producing information related to the movement by said moving means, and (iv) control means for determining an input to be applied to said moving means so as to bring the original and the workpiece into the predetermined positional relationship, on the basis of a detected value obtained through said alignment detecting means and a plurality of measured values obtained through said measuring means, all being taken up at the same time, and for controlling said moving means on the basis of the thus determined input.

6. An apparatus according to claim 5, wherein said control means calculates an average value of the plurality of measured values and determines the input to be applied to said moving means on the basis of the detected value and the average value of the plurality of measured values.

7. A device manufacturing method, comprising the steps of:

aligning an original, having a pattern, and a substrate; and transferring the pattern of the original onto the substrate being relatively aligned with the original;

wherein said aligning step includes (i) detecting a relative deviation of the original and the substrate from a predetermined positional relationship (ii) measuring the position of the substrate (iii) determining an input effective to bring the original and the substrate into the predetermined positional relationship, on the basis of a detected value obtained through said deviation detection and a plurality of measured values obtained through said measurement, all being taken up at the same time, and (iv) adjusting the positional relationship of the original and the substrate on the basis of the thus determined input.

8. A method according to claim 7, wherein said determining step includes the steps of calculating an average value of the plurality of measured values and determining the input effective to bring the original and the substrate into the predetermined positional relationship, on the basis of the detected value and the average value of the plurality of measured values.

* * * * *

UNITED STATES PATENT AND TRADEMARK OFFICE
CERTIFICATE OF CORRECTION

PATENT NO. : 5,379,108
DATED : January 3, 1995
INVENTOR(S) : NORIYUKI NOSE, ET AL.

It is certified that error appears in the above-indentified patent and that said Letters Patent is hereby corrected as shown below:

IN THE DRAWINGS

FIG. 10

STEP 1

"DESIGE" should read --DESIGN--.

FIG. 11

STEP 13

"ELCTRODE" should read --ELECTRODE--.

STEP 15

"RESIT" should read --RESIST--.

COLUMN 1

Line 56, "relatively" should be deleted.

COLUMN 2

Line 28, "processes." should read --process.--.

COLUMN 3

Line 3, "mask-to-waver" should read --mask-to-wafer--.

UNITED STATES PATENT AND TRADEMARK OFFICE
CERTIFICATE OF CORRECTION

PATENT NO. : 5,379,108
DATED : January 3, 1995
INVENTOR(S) : NORIYUKI NOSE, ET AL.

It is certified that error appears in the above-indentified patent and that said Letters Patent is hereby corrected as shown below:

COLUMN 8

```
Line 3, "relationship" should read --relationship,--.
Line 4, "substrate" should read --substrate,--.
```

Signed and Sealed this

Ninth Day of May, 1995

Attest:

BRUCE LEHMAN

Attesting Officer      Commissioner of Patents and Trademarks